United States Patent
Hsu et al.

(10) Patent No.: US 9,923,102 B2
(45) Date of Patent: Mar. 20, 2018

(54) SOLAR CELL

(71) Applicant: NEO SOLAR POWER CORP., Hsinchu (TW)

(72) Inventors: Tzu-Chin Hsu, Hsinchu (TW); Kun-Chih Lin, Hsinchu (TW); Chia-Pang Kuo, Hsinchu (TW); Han-Cheng Lee, Hsinchu (TW)

(73) Assignee: NEO SOLAR POWER CORP., Hsinchu (TW)

( * ) Notice: Subject to any disclaimer, the term of this patent is extended or adjusted under 35 U.S.C. 154(b) by 146 days.

(21) Appl. No.: 14/859,592

(22) Filed: Sep. 21, 2015

(65) Prior Publication Data

US 2016/0284873 A1    Sep. 29, 2016

(30) Foreign Application Priority Data

Mar. 27, 2015 (TW) .............................. 104204733 U

(51) Int. Cl.
  *H01L 31/0224* (2006.01)
  *H01L 31/02* (2006.01)
  *H01L 31/0216* (2014.01)
  *H01L 31/068* (2012.01)

(52) U.S. Cl.
  CPC .... *H01L 31/0201* (2013.01); *H01L 31/02167* (2013.01); *H01L 31/068* (2013.01); *Y02E 10/547* (2013.01)

(58) Field of Classification Search
  None
  See application file for complete search history.

(56) References Cited

U.S. PATENT DOCUMENTS

2010/0275965 A1* 11/2010 Lee ................... H01L 31/02167
                                                          136/244
2011/0254117 A1* 10/2011 Kozicki ................... C25D 7/08
                                                          257/461

OTHER PUBLICATIONS

Oxford English Dictionary "surround, v." OED Online. Oxford University Press, Jun. 2017. Web. Nov. 13, 2017 (Year: 2017).*

* cited by examiner

*Primary Examiner* — Magali P Slawski
(74) *Attorney, Agent, or Firm* — Rabin & Berdo, P.C.

(57) ABSTRACT

A solar cell includes a semiconductor substrate, a passivation layer, a back electrode layer, and several bus bars. The semiconductor substrate has an upper surface and a lower surface opposite with each other. The passivation layer is disposed at the lower surface and includes several blank regions and several first openings. Each first opening is not located in the blank regions. The bus bars are respectively disposed on the blank regions of the passivation layer. The back electrode layer is disposed on the passivation layer and electrically connected to the semiconductor substrate through the first openings. The back electrode layer includes several second openings corresponding to the bus bars, respectively. The size of each second opening is not greater than the size of the corresponding bus bar, so that the back electrode layer is electrically connected to the bus bars.

7 Claims, 9 Drawing Sheets

SOLAR CELL

CROSS-REFERENCES TO RELATED APPLICATIONS

This non-provisional application claims priority under 35 U.S.C. § 119(a) on Patent Application No. 104204733 filed in Taiwan, R.O.C. on Mar. 27, 2015, the entire contents of which are hereby incorporated by reference.

BACKGROUND

Technical Field

The instant disclosure relates to a solar cell.

Related Art

Recently, various advanced technologies are developed to increase the conversion efficiency of solar cells so as to satisfy the market requirements of solar cells with high conversion efficiencies.

So far, solar cells with high conversion efficiencies include heterojunction with intrinsic thin-layer (HIT) solar cell, selective emitter solar cell, passivated emitter rear cell (PERC) solar cell, etc. Specifically, for the PERC solar cell, passivated techniques are applied to the solar cell to passivate the rear of the solar cell and emitter electrodes at the front of the solar cell, such that the recombination possibility of the electron-hole pair at the surface of the semiconductor substrate can be reduced, thereby improving the conversion efficiency of the solar cell.

Therefore, in manufacturing the rear of a PERC cell, firstly plasma-enhanced chemical vapor deposition (PECVD) techniques would be applied to the rear of a semiconductor substrate to form passivation layer, and then a plurality of openings is formed on the passivation layer through laser ablation or etching techniques. Next, aluminum pastes are screen printed on the passivation layer, and the aluminum pastes are passing through the openings and in contact with the semiconductor substrate. Lastly, silver pastes are screen printed on the semiconductor substrate. Therefore, the pastes are collectively sintered to form back electrodes and bus bars.

However, because there are openings formed by laser ablation under the bus bars of the existing PERC solar cell, the bus bars would be deformed or uneven easily when the pressure applied over the semiconductor substrate is not uniform. In addition, if too many openings in the passivation layer, the performance of the solar cell would be adversely affected. Although the Aluminum paste can recover part of the mechanical strength loss of the opening region, silver paste cannot, so the mechanical strength of the solar cell would draw down and raise the breakage rate.

SUMMARY

An embodiment of the present invention is a solar cell comprising a semiconductor substrate, a passivation layer, a back electrode layer, and a plurality of bus bars. The semiconductor substrate has an upper surface and a lower surface opposite to the upper surface. The passivation layer is disposed at the lower surface of the semiconductor substrate. The passivation layer comprises a plurality of blank regions and a plurality of first openings. Each of the first openings is not located in the blank regions. The bus bars are respectively disposed on the blank regions of the passivation layer. The back electrode layer is disposed on the passivation layer and electrically connected to the semiconductor substrate through the first openings. The back electrode layer comprises a plurality of second openings corresponding to the bus bars, respectively. The size of each of the second openings is not greater than the size of the corresponding bus bar, so that the back electrode layer is electrically connected to the bus bars.

In one embodiment, a width of each of the bus bars is greater than a distance between two adjacent first openings.

In one embodiment, each of the bus bars is spaced from the periphery of the corresponding blank region by a first distance along a transversal direction (i.e., the X axis), and each of the bus bars is spaced from the periphery of the corresponding blank region by a second distance along a longitudinal direction (i.e., the Y axis).

In one embodiment, the first distance is in the range of 500 micrometers to 1500 micrometers, preferably, 500 micrometers to 800 micrometers.

In one embodiment, the second distance is in the range of 500 micrometers to 1500 micrometers, preferably, 500 micrometers to 800 micrometers.

In one embodiment, the first openings are parallel with each other, and the length direction of the bus bars is parallel to the length direction of the first openings.

In one embodiment, the first openings are parallel with each other, and the length direction of the bus bars is perpendicular to the length direction of the first openings.

In one embodiment, each of the blank regions is selected form a group consisting of rectangular shape, rhombic shape, elliptical shape, hexagonal shape, octagonal shape, and a combinations thereof.

In one embodiment, the edge of each of the bus bars is overlapped with the edge of the second opening of the back electrode layer.

Another embodiment of the present invention is a solar cell comprising a semiconductor substrate, a passivation layer, a back electrode layer, and a plurality of bus bars. The semiconductor substrate has an upper surface and a lower surface opposite to the upper surface. The passivation layer is disposed at the lower surface of the semiconductor substrate. The passivation layer comprises a plurality of blank regions and a plurality of first openings. Each of the first openings is not located in the blank regions. The back electrode layer is disposed on the passivation layer and electrically connected to the semiconductor substrate through the first openings. The back electrode layer comprises a plurality of second openings corresponding to the blank regions, respectively. The bus bars are respectively corresponding to the second openings and electrically connected to the back electrode layer.

In one embodiment, a width of each of the bus bars is greater than a distance between two adjacent first openings.

In one embodiment, the projection of each of the bus bars on the passivation layer is spaced from the periphery of the corresponding blank region by a first distance along a transversal direction (i.e., the X axis), and the projection of each of the bus bars on the passivation layer is spaced from the periphery of the corresponding blank region by a second distance along a longitudinal direction (i.e., the Y axis).

In one embodiment, the first distance is in the range of 500 micrometers to 1500 micrometers, preferably, 500 micrometers to 800 micrometers.

In one embodiment, the second distance is in the range of 500 micrometers to 1500 micrometers, preferably, 500 micrometers to 800 micrometers.

In one embodiment, the first openings are parallel with each other, and the length direction of the bus bars is parallel to the length direction of the first openings.

In one embodiment, the first openings are parallel with each other, and the length direction of the bus bars is perpendicular to the length direction of the first openings.

In one embodiment, each of the blank regions is selected from the group consisting of rectangular shape, rhombic shape, elliptical shape, hexagonal shape, octagonal shape, and a combination thereof.

In one embodiment, the edge of each of the bus bars is overlapped with the edge of the second opening of the back electrode layer.

Accordingly, based on embodiments of the solar cell, the blank regions on the passivation layer corresponding to the bus bars are preserved, so that no first opening is located at the passivation layer below the bus bars. Therefore, the pressure between the bus bars and the passivation layer is uniform, and the solar cell would not deform easily. Moreover, the preservation of blank regions further reduce the number (or the area) of the first openings. Hence, the conversion efficiency of the solar cell can be improved, and the overall structural strength of the solar cell can be enhanced.

Detailed description of the characteristics and the advantages of the disclosure is shown in the following embodiments, the technical content and the implementation of the disclosure should be readily apparent to any person skilled in the art from the detailed description, and the purposes and the advantages of the disclosure should be readily understood by any person skilled in the art with reference to content, claims and drawings in the disclosure.

BRIEF DESCRIPTION OF THE DRAWINGS

The disclosure will become more fully understood from the detailed description given herein below for illustration only, and thus not limitative of the disclosure, wherein.

DETAILED DESCRIPTION

Figure 1:
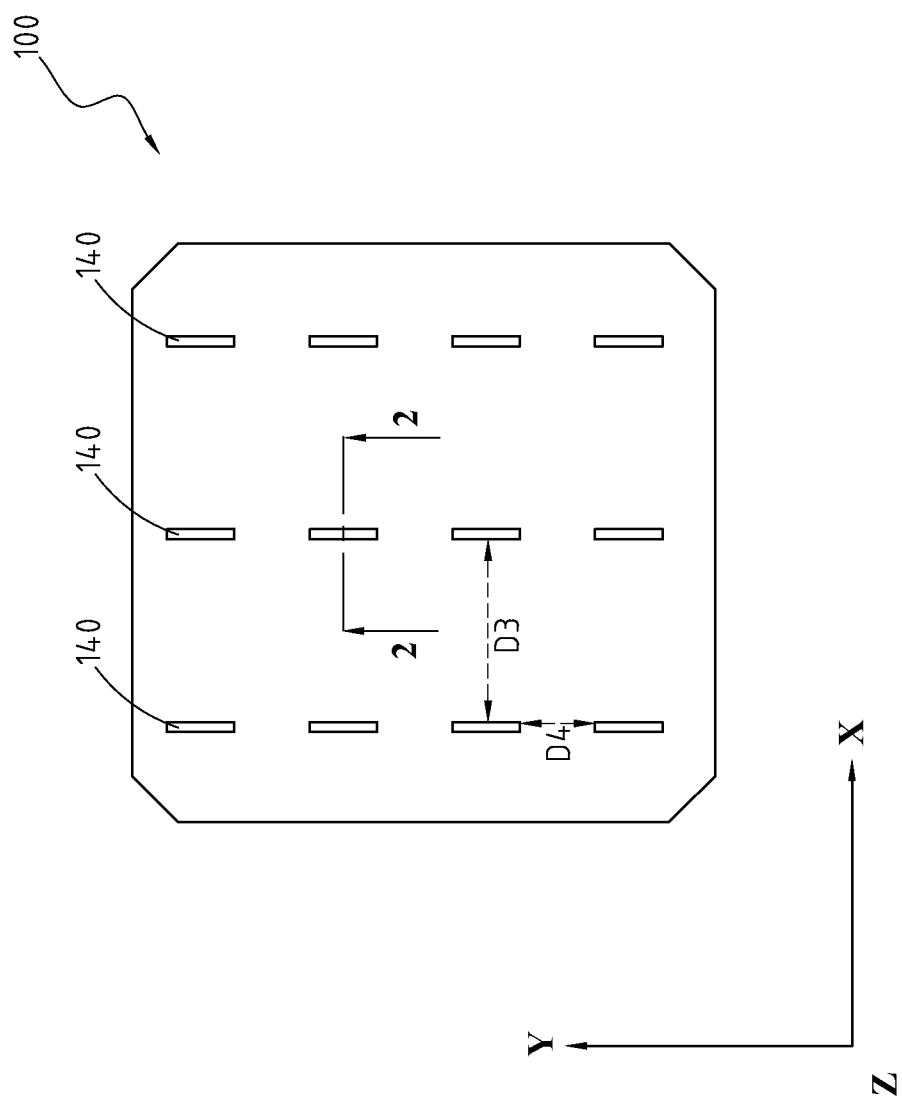
FIG. 1 is a top view of a back side of a solar cell according an exemplary embodiment of the instant disclosure.
Figure 2:
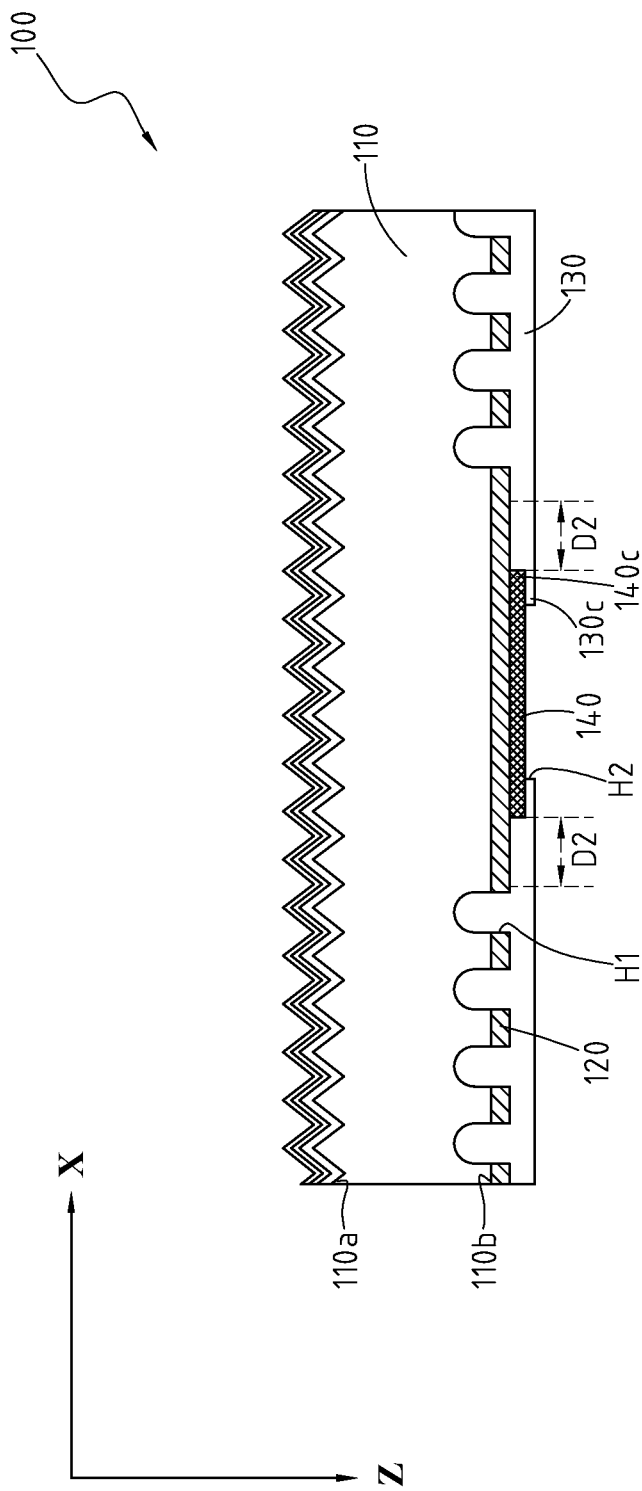
FIG. 2 is a lateral cross-sectional view of FIG. 1 along line 2-2.
Figure 3:
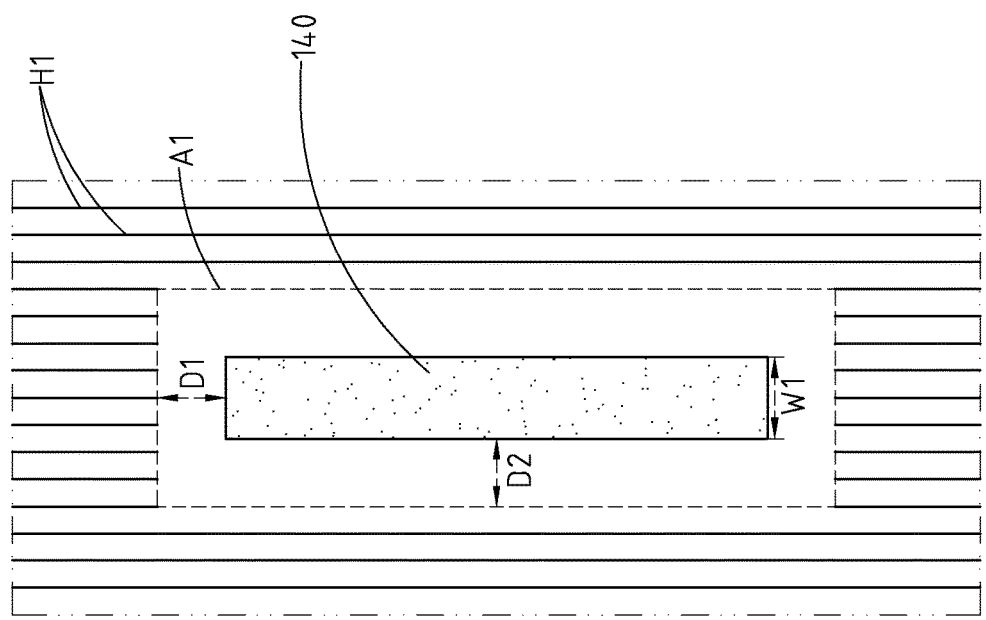
FIG. 3 is a partial enlarged schematic view of FIG. 1.

FIG. 1 is a top view of a back side of a solar cell 100 according to an exemplary embodiment of the instant disclosure. FIG. 2 is a lateral cross-sectional view of FIG. 1 along line 2-2. FIG. 3 is a partial enlarged view of FIG. 1. Specifically, a back electrode layer 130 is not illustrated in FIG. 3 to allow the blank region A1 to be illustrated clearly. Please refer to FIGS. 1-3, an embodiment of a solar cell 100 is provided. The solar cell 100 comprises a semiconductor substrate 110, a passivation layer 120, a plurality of bus bars 140, and a back electrode layer 130.

The semiconductor substrate 110 has an upper surface 110a and a lower surface 110b opposite to the upper surface 110a. The upper surface 110a of the semiconductor substrate 110 may be a textured surface so as to improve the amount of light entering the semiconductor substrate 110. In this embodiment, the semiconductor substrate 110 may be a doped (N-type doped or P-type doped) single crystalline silicon substrate, or may be a doped polycrystalline silicon substrate.

The passivation layer 120 is disposed on the lower surface 110b of the semiconductor substrate 110. The passivation layer 120 can reduce the recombination of electron hole pairs at the surface of the semiconductor substrate 110 so as to increase the photoelectric conversion efficiency. In this embodiment, the passivation layer 120 may be made of silicon dioxide ($SiO_2$), silicon oxynitride ($SiO_xN_y$), aluminum oxide ($Al_2O_3$), silicon nitride (SiNx), etc. The passivation layer 120 may be formed on the lower surface 110b of the semiconductor substrate 110 by plasma enhanced chemical vapor deposition (PECVD) techniques. Alternatively, in other embodiments, the passivation layer 120 may be formed by atomic layer deposition (ALD) techniques.

The passivation layer 120 comprises a plurality of blank regions A1 and a plurality of first openings H1. In this embodiment, the blank regions A1 are intentionally reserved for disposing bus bars 140, and laser ablation techniques are not applied to the blank regions A1. Therefore, the first openings H1 are not located in the blank regions A1. The first openings H1 are extended along the Y axis, i.e., the longitudinal direction. As shown in FIG. 3, the first openings H1 are extended to the two sides of the lower surface 110b of the semiconductor substrate 110 along the Y axis.

In addition, as shown in FIG. 1, the bus bars 140 of the solar cell 100 are arranged in two dimensional arrays. That is, the bus bars 140 are equidistantly arranged on the solar cell 100 along the X axis, i.e., the transversal direction, and two adjacent bus bars 140 are spaced from each other by a distance D3 along the Y axis. In addition, the bus bars 140 are equidistantly arranged on the solar cell 100 along the Y axis, and two adjacent bus bars 140 are spaced from each other by a distance D4 along the Y axis. Therefore, based on the layout of the bus bars 140, the blank regions A1 are arranged on the passivation layer 120 to form a two dimensional array.

The first openings H1 are defined through the passivation layer 120, and each of the first openings H1 is not located in the blank regions A1. In other words, as shown in FIG. 3, no first opening H1 is formed at the blank regions A1 of the passivation layer 120. In this embodiment, the first openings H1 may be, but not limited to, formed by physical hole opening processes, such as laser ablation. The first openings H1 may be formed by etching techniques using chemicals like phosphorus acid, hydrofluoric acid, nitric acid, etc. The first openings H1 are formed on the passivation layer 120 equidistantly, but embodiments are not limited thereto. The first openings H1 may be formed on the passivation layer 120 in a non-equidistant manner. Besides, the first openings H1 may be of bar shape or round shape. In this embodiment, the first openings H1 are illustrated, but not limited to, as bar shaped.

And then, the bus bars 140, each having a width of W1, are respectively disposed on the blank regions A1 of the passivation layer 120. Next, a back electrode layer 130 is disposed on the passivation layer 120. The back electrode layer 130 may be in contact with the lower surface 110b of the semiconductor substrate 110 through the first openings H1 opened on the passivation layer 120, so that the back electrode layer 130 is electrically connected to the semiconductor substrate 110. The back electrode layer 130 comprises a plurality of second openings H2 opened thereon and corresponding to the bus bars 140. In this embodiment, the size of each of the bus bars 140 is less than the size of the corresponding blank region A1. The size of each of the second openings H2 is slightly less than the size of the corresponding bus bar 140. The shape of the second opening 140 is substantially the same as the shape of the bus bar 140. Additionally, the width of each of the second openings H2 is greater than the distance between two adjacent first openings H1; the width of each of the bus bars 140 is greater than the distance between two adjacent first openings H1, and then the series resistance between two adjacent bur bars 140 will be decreased, so the conversion efficiency of the solar cell can be improved.

In this embodiment, the bus bars 140 may be, but not limited to, formed by screen printing or coating. The bus bars 140 may be, but not limited to, made of conductive pastes including aluminum or silver. The back electrode layer 130 may be, but not limited to, formed by screen printing or coating. Therefore, the second openings H2 and the back electrode layer 130 can be formed on the passivation layer 120. Alternatively, the second openings H2 may be formed on the back electrode layer 130 by physical or chemical hole opening processes after the back electrode layer 130 is formed on the passivation layer 120. Here, the back electrode layer 130 may be made of conductive paste including aluminum and/or silver.

In this embodiment, each of the blank regions A1 has the back electrode layer 130 and the corresponding bus bar 140, and the second openings H2 of the back electrode layer 130 are corresponding to the bus bars 140, respectively. Since the second opening H2 is slightly less than the bus bar 140, the edge 140c of the bus bar 140 is partially overlapped with the edge 130c of the second opening H2 of the back electrode layer 130. That is, parts of the back electrode layer 130 is stacked on the edges 140c of the bus bars 140 and electrically connected to the bus bars 140. Therefore, the current come from the back electrode layer 130 can be collected by the bus bars 140.

Figure 4:
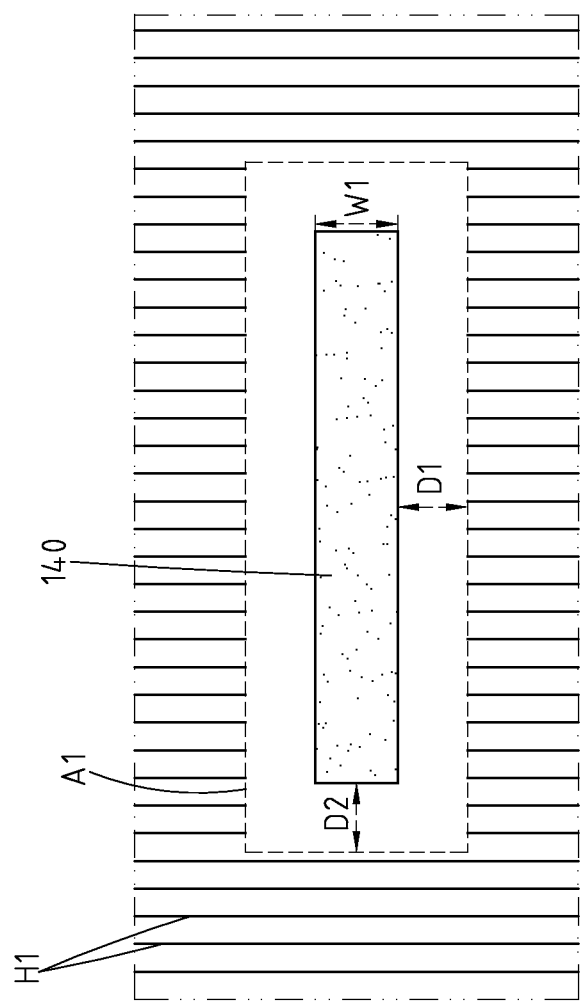
FIG. 4 is a partial enlarged schematic view of the back side of the solar cell according to the exemplary embodiment of the instant disclosure, for one variation.

In this embodiment, the first openings H1 are parallel with each other, and the length direction of the bus bars 140 is parallel to the length direction of the first openings H1, as shown in FIG. 3. In another embodiment, as shown in FIG. 4, the first openings H1 are parallel with each other, and the length direction of the bus bars 140 is perpendicular to the length direction of the first openings H1. In other words, the length direction of the bus bars 140 may be parallel to or perpendicular to the length direction of the first openings H1. Besides, no matter how the bus bars 140 are arranged, the bus bars 140 are located in the blank regions A1, respectively, and no first opening H1 would be below the bus bars 140.

Please refer to FIG. 3 again. In this embodiment, the blank regions A1 are approximately of rectangular shape. Each of the bus bars 140 and the periphery of the corresponding blank region A1 are spaced by a first distance D1 along the X axis (i.e., the transversal direction). The first distance D1 represents the maximum distance between each of the bus bars 140 and the periphery of the corresponding blank region A1 along the X axis. Similarly, each of the bus bars 140 and the periphery of the corresponding blank region A1 are spaced by a second distance D2 along the Y axis (i.e., the longitudinal direction). The second distance D2 represents the maximum distance between each of the bus bars 140 and the periphery of the corresponding blank region A1 along the Y axis. Here, the first distance D1 is substantially equal to the second distance D2, but embodiments are not limited thereto.

Figure 6:
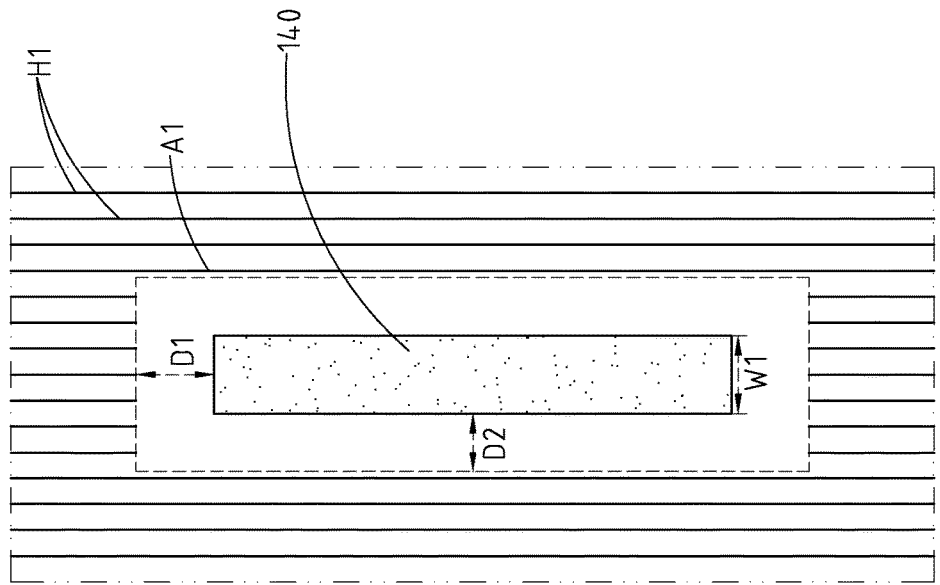
FIG. 6 is a schematic view (2) of a blank region of the solar cell according to the instant disclosure.
Figure 5:
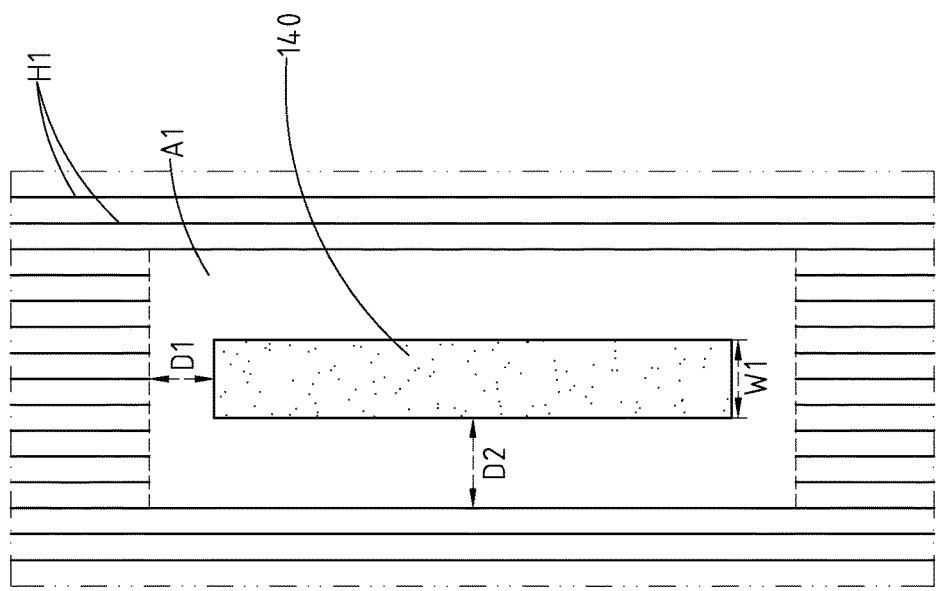
FIG. 5 is a schematic view (1) of a blank region of the solar cell according to the instant disclosure.

Please refer to FIG. 5 and FIG. 6. In this embodiment, the blank regions A1 are of rectangular shape. Specifically, in FIG. 5, the first distance D1 between each of the bus bars 140 and the periphery of the corresponding blank region A1 along the X axis is substantially less than the second distance D2 between each of the bus bars 140 and the periphery of the corresponding blank region A1 along the Y axis, while, in FIG. 6, the first distance D1 between each of the bus bars 140 and the periphery of the corresponding blank region A1 along the X axis is substantially greater than the second distance D2 between each of the bus bars 140 and the periphery of the corresponding blank region A1 along the Y axis.

Therefore, the first distance D1 may be not equal to the second distance D2.

Figure 7:
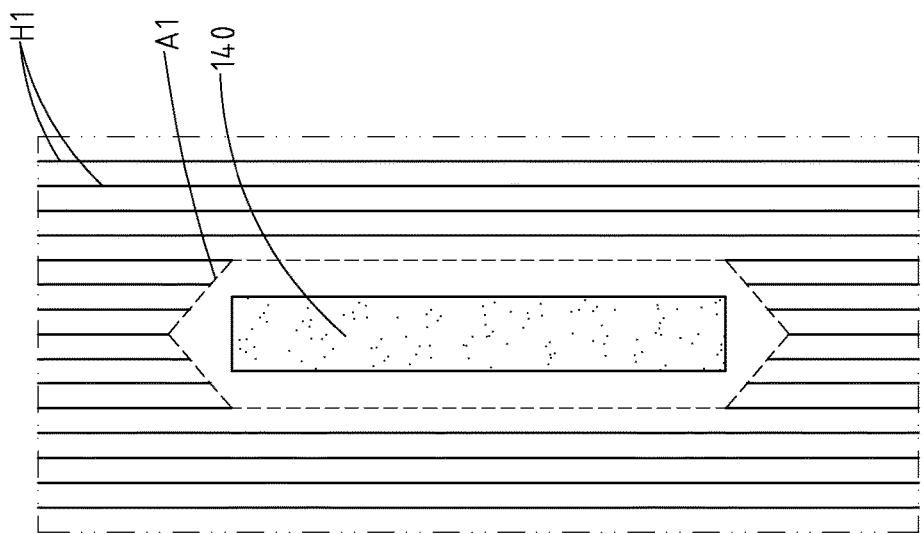
FIG. 7 is a schematic view (3) of a blank region of the solar cell according to the instant disclosure.

Please refer to FIG. 7. In this embodiment, the blank regions A1 are of hexagonal shape, and each of the blank regions A1 has two long sides and four short sides. The two long sides are parallel and have equal lengths. The four short sides are parallel in pairs and have equal lengths. The bus bar 140 is rectangular and has two long sides and two short sides. The two long sides are parallel and have equal lengths. The two short sides are parallel and have equal lengths. The bus bar 140 is substantially located at the center of the blank region A1, i.e., the long axis of the bus bar 140 may be overlapped with the long axis of the blank region A1, and the short axis of the bus bar 140 may be overlapped with the short axis of the blank region A1; that is, the geometrical center of the bus bar 140 may be overlapped with the geometrical center of the blank region A1. As shown, the length of the long sides of the bus bar 140 is equal to the length of the long sides of the blank region A1, and the long sides of the bus bar 140 are parallel to the long sides of the blank region A1. Each of the short sides of the bus bar 140 defines an included angle with the adjacent short side of the blank region A1, and the magnitude of the included angle is depended on the shape of the blank region A1.

Figure 8:
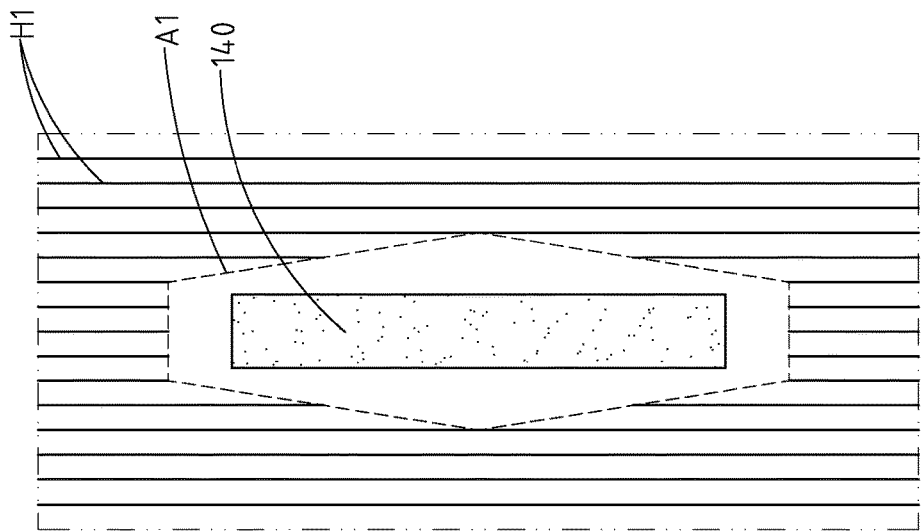
FIG. 8 is a schematic view (4) of a blank region of the solar cell according to the instant disclosure.

Please refer to FIG. 8. In this embodiment, the blank regions A1 are of hexagonal shape. In FIG. 8, each of the blank regions A1 has four long sides and two short sides. The four long sides are parallel in pairs and have equal lengths. The two short sides are parallel and have equal lengths. The bus bar 140 is rectangular and has two long sides and two short sides. The two long sides are parallel and have equal lengths. The two short sides are parallel and have equal lengths. The bus bar 140 is located at the center of the blank region A1, i.e., the center axis of the bus bar 140 along the Y axis is overlapped with the center axis of the blank region A1 along the Y axis. As shown, the length of the short sides of the bus bar 140 is less than the length of the adjacent short side of the blank region A1, and the short sides of the bus bar 140 is parallel to the short sides of the blank region A1. Each of the long sides of the bus bar 140 defines an included angle with the adjacent long side of the blank region A1, and the magnitude of the included angle is depended on the shape of the blank region A1.

Figure 9:
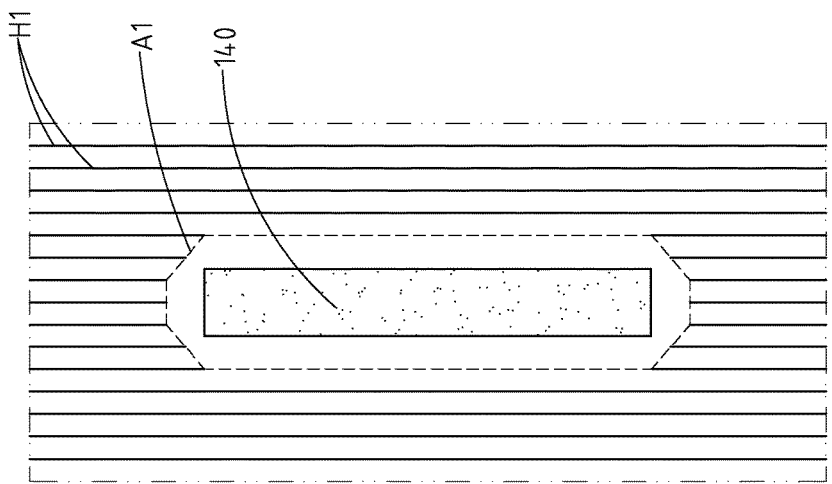
FIG. 9 is a schematic view (5) of a blank region of the solar cell according to the instant disclosure.

Please refer to FIG. 9. In this embodiment, the blank regions A1 are of rhombic shape. As shown, the bus bar 140 is of rectangular shape and located at the center of the blank region A1, i.e., the center axis of the bus bar 140 along the Y axis is overlapped with the center axis of the blank region A1 along the Y axis.

Figure 10:
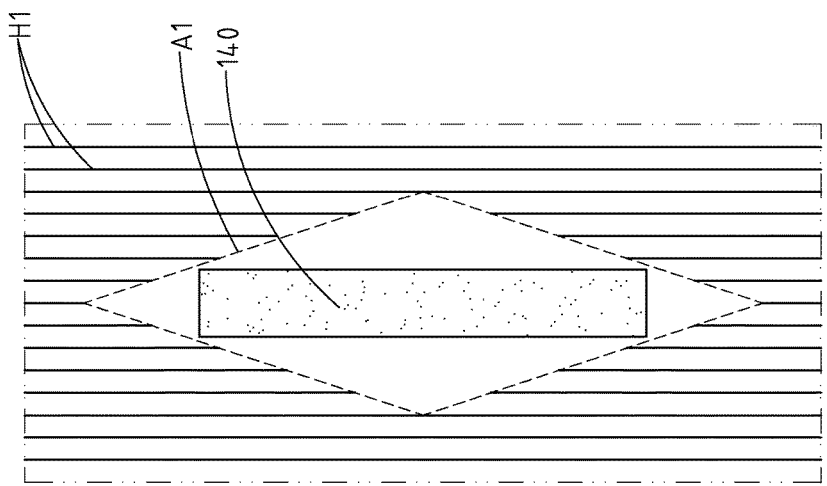
FIG. 10 is a schematic view (6) of a blank region of the solar cell according to the instant disclosure.

Please refer to FIG. 10. In this embodiment, the blank regions A1 are of octagonal shape. As shown, the bus bar 140 is of rectangular shape and located at the center of the blank region A1, i.e., the center axis of the bus bar 140 along the Y axis is overlapped with the center axis of the blank region A1 along the Y axis.

Figure 13:
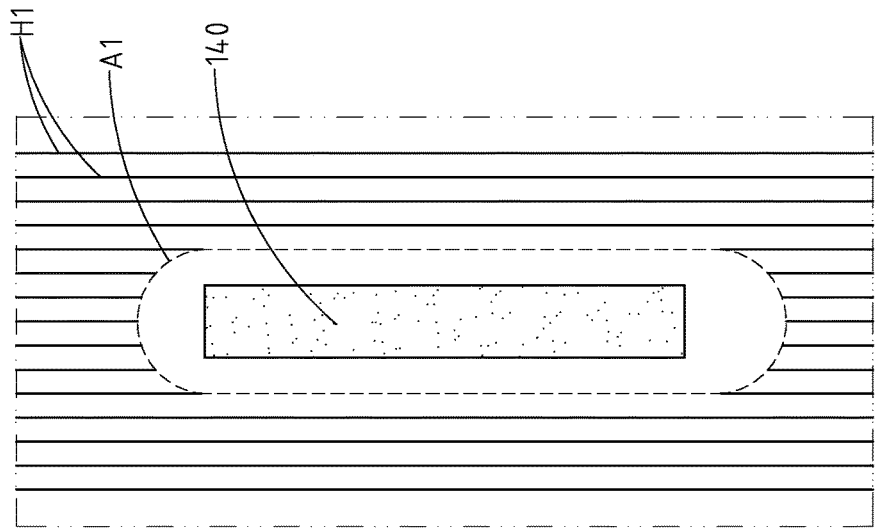
FIG. 13 is a schematic view (9) of a blank region of the solar cell according to the instant disclosure.
Figure 12:
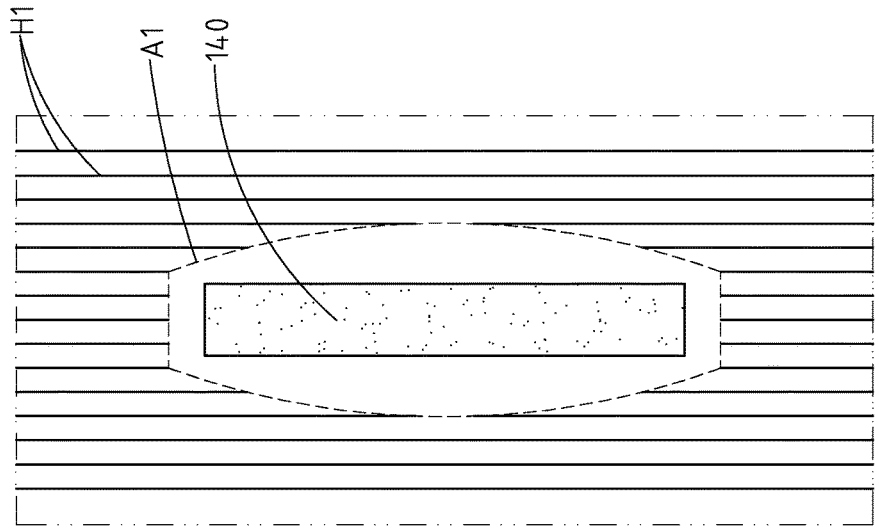
FIG. 12 is a schematic view (8) of a blank region of the solar cell according to the instant disclosure.
Figure 11:
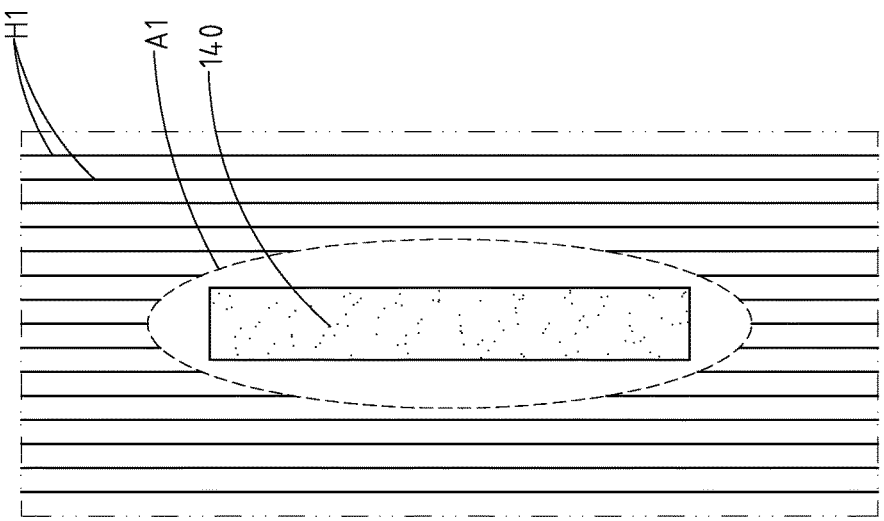
FIG. 11 is a schematic view (7) of a blank region of the solar cell according to the instant disclosure.

Please refer to FIGS. 11 to 13. The blank regions A1 may be of elliptical shape or rectangular shape having partly curved edges. Similarly, the bus bar 140 is of rectangular shape and located at the center of the blank region A1, i.e., the center axis of the bus bar 140 along the Y axis is overlapped with the center axis of the blank region A1 along the Y axis.

It is understood that, the size or the shape of the blank regions A1 and the position, the length, or the orientation of the first openings H1 on the passivation layer 120 can be tuned by the etching device, e.g., a laser. Therefore, the forgoing embodiments are provided as illustrative purposes and not as a limitation of the instant disclosure. That is, the blank regions A1 may be carried out by, but not limited to, the aforementioned embodiments. It is also realized that the blank regions A1 may be, for example, of any two of, three of, four or more of the aforementioned shapes.

According to the embodiments of the solar cell 100, the first distance D1 is in the range of 500 micrometers to 1500 micrometers, preferably, in the range of 500 micrometers to 800 micrometers, e.g., 500, 600, 700, 800 micrometers. The second distance D2 is in the range of 500 micrometers to 1500 micrometers, preferably, in the range of 500 micrometers to 800 micrometers, e.g., 500, 600, 700, 800 micrometers. The length of the first distance D1 and that of the second distance D2 are adjustable based on different shapes of the blank region A1.

Figure 14:
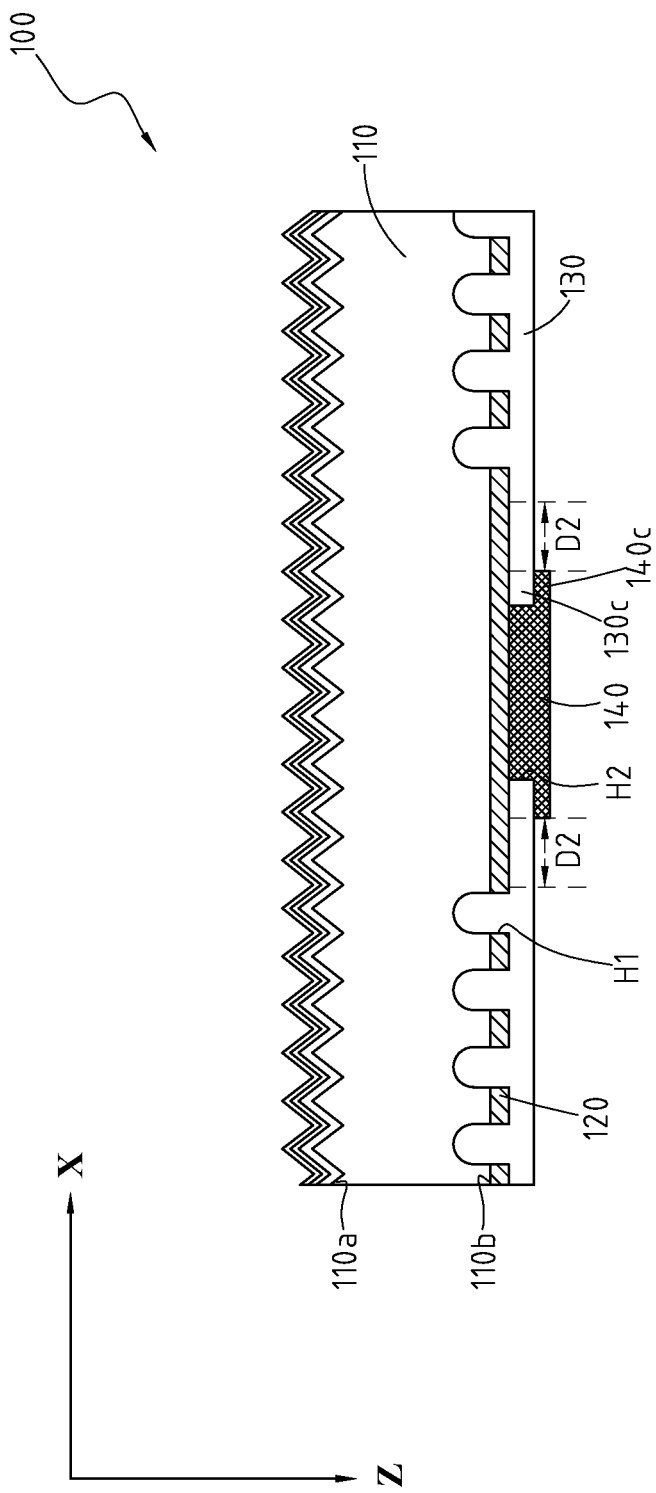
FIG. 14 is a lateral cross-sectional view of a solar cell according to another exemplary embodiment of the instant disclosure.

FIG. 14 is a lateral cross-sectional view of a solar cell 100 according to another exemplary embodiment of the instant disclosure, and FIG. 14 is a sectional view along the 1-1 line of FIG. 1. Please refer to FIG. 14 along with FIGS. 3 to 13. In another exemplary embodiment, the solar cell 100 comprises a semiconductor substrate 110, a passivation layer 120, a back electrode layer 130, and a plurality of bus bars 140. The passivation layer 120 is disposed on the lower surface 110b of the semiconductor substrate 110 and comprises a plurality of blank regions A1 and a plurality of first openings H1.

The structure of the solar cell 100 described in this embodiment is approximately similar to that of the foregoing embodiments, except that the manufacturing sequence of the back electrode layer 130 and the bus bars 140. Hereinafter, the back electrode layer 130 and the bus bars 140 are depicted in detail.

The back electrode layer 130 is disposed on the passivation layer 120. The back electrode layer 130 is in contact with parts of the back side (i.e., the lower surface) of the semiconductor substrate 110 through the first openings H1 opened on the passivation layer 120. Therefore, the back electrode layer 130 is electrically connected to the semiconductor substrate 110.

The back electrode layer 130 comprises a plurality of second openings H2, and each of the second openings H2 is corresponding to the blank region A1 and formed on the back electrode layer 130. The second opening H2 is less than the blank region A1, and portion of the blank region A1 would be exposed.

In this embodiment, the back electrode layer 130 may be formed by screen printing or coating, therefore, the second openings H2 and the back electrode layer 130 may be, but not limited to, collectively formed on the passivation layer 120. Alternatively, the second openings H2 may be formed on the back electrode layer 130 by physical or chemical opening opening processes after the back electrode layer 130 is formed on the passivation layer 120. The back electrode layer 130 may be made of conductive pastes including aluminum and/or silver.

After the back electrode layer 130 is disposed on the passivation layer 120, the bus bars 140 are corresponding to the second openings H2 of the back electrode layer 130 and electrically connected to the back electrode layer 130. As shown in FIG. 14, in order to allow the bus bars 140 to be firmly in contact with the back electrode layer 130 and to allow the bus bars 140 to be electrically connected to the back electrode layer 130, the edge 140c of each of the bus bars 140 is partially overlapped with the edge 130c of the corresponding second opening H2 of the back electrode layer 130. In this embodiment, the second opening H2 is slightly less than the bus bar 140, and the edge 140c of each of the bus bars 140 is stacked on the edge 130c of the corresponding second opening H2. Therefore, the bus bars 140 can be electrically connected to the back electrode layer 130 so as to collect the current come from the back electrode layer 130.

In this embodiment, the bus bars 140 may be formed by screen printing or coating. In addition, the bus bars 140 may be, but not limited to, made of conductive pastes including aluminum and/or silver.

Each of the bus bars 140 is disposed to the corresponding second opening H2, and each of the second openings H2 is disposed to the corresponding blank region A1. Therefore, in this embodiment, no first opening H1 would be defined at the passivation layer 120 below each of the bus bars 140.

In addition, the projection of each of the bus bars 140 on the passivation layer 120 is spaced from the periphery of the corresponding blank region A1 by a first distance D1 along the X axis (i.e., the transversal direction), and the projection of each of the bus bars 140 on the passivation layer 120 is spaced from the periphery of the corresponding blank region A1 by a second distance along the Y axis (i.e., the longitudinal direction). Specifically, as shown in FIG. 3 or FIG. 4, the first distance D1 may be equal to the second distance D2, but embodiments are not limited thereto. Alternatively, the first distance D1 may be not equal to the second distance D2, as shown in FIG. 5 or FIG. 6.

In this embodiment, the first distance D1 is in the range of 500 micrometers to 1500 micrometers, e.g., 500, 600, 700, 800, 900, 1000, 1100, 1200, 1300, 1400, 1500 micrometers, preferably, in the range of 500 micrometers to 800 micrometers. The second distance D2 is in the range of 500 micrometers to 1500 micrometers, preferably, in the range of 500 micrometers to 800 micrometers. The length of the first distance D1 and that of the second distance D2 are adjustable based on different shapes of the blank region A1.

Accordingly, based on the embodiments of the solar cell of present invention, the blank regions on the passivation layer corresponding to the bus bars are formed, so that no first opening is located at the passivation layer below the bus bars. Therefore, the pressure between the bus bars and the passivation layer is uniform, and the solar cell would not deform easily. The blank regions can prevent the decrease of mechanical strength of the bus bars of the lower surface, and then it can reduce the breakage rate of solar cell while soldering. Moreover, the preservation of blank regions further reduce the number (or the area) of the first openings. Hence, the conversion efficiency of the solar cell can be improved, and the overall structural strength of the solar cell can be enhanced.

While the disclosure has been described by the way of example and in terms of the preferred embodiments, it is to be understood that the invention need not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. A solar cell, comprising:
    a semiconductor substrate having an upper surface and a lower surface opposite to the upper surface;
    a passivation layer that is disposed at the lower surface, and that comprises:
        a plurality of blank regions; and
        a plurality of first openings that are not located in the blank regions;
    a plurality of bus bars that are respectively disposed on a blank region of the plurality of blank regions of the passivation layer and that are arranged in a two dimensional array, each bus bar of the plurality of bus bars being spaced from a periphery of a corresponding blank region (a) by a first distance along a transverse direction of the corresponding blank region and (b) by a second distance along a longitudinal direction of the corresponding blank region, and each bus bar of the plurality of bus bars being surrounded (c) by first openings of the plurality of first openings; and
    a back electrode layer that is disposed on the passivation layer, that is electrically connected to the semiconductor substrate through the plurality of first openings, that comprises a plurality of second openings corresponding to the plurality of bus bars, respectively, each second opening of the plurality of second openings having a size that is not greater than that of a corresponding bus bar, so that the back electrode layer is electrically connected to the plurality of bus bars.

2. The solar cell according to claim 1, wherein two adjacent first openings of the plurality of first openings are spaced apart by a distance, and wherein each bus bar of the plurality of bus bars has a width that is greater than the distance between the two adjacent first openings.

3. The solar cell according to claim 1, wherein the first distance and the second distance range from 500 micrometers to 1500 micrometers.

4. The solar cell according to claim 1, wherein the plurality of bus bars extends in a length direction, and wherein each first opening of the plurality of first openings extends in a length direction, is a stripe-shaped groove, and is disposed on the passivation layer with its length direction parallel to the length direction of the plurality of bus bars.

5. The solar cell according to claim 1, wherein the plurality of bus bars extends in a length direction, and wherein each first opening of the plurality of first openings extends in a length direction, is a stripe-shaped groove, and is disposed on the passivation layer with its length direction perpendicular to the length direction of the plurality of the bus bars.

6. The solar cell according to claim 1, wherein each blank region of the plurality of blank regions has a shape that is selected from the group consisting of a rectangular shape, a rhombic shape, an elliptical shape, a hexagonal shape, an octagonal shape, and combinations thereof.

7. The solar cell according to claim 1, wherein each second opening of the plurality of second openings has an edge, and wherein each bus bar of the plurality of bus bars has an edge that is overlapped with the edge of one second opening of the plurality of second openings of the back electrode layer.

* * * * *